United States Patent [19]
Dauksher et al.

[11] Patent Number: 6,124,063
[45] Date of Patent: Sep. 26, 2000

[54] METHOD OF FORMING A SEMICONDUCTOR DEVICE UTILIZING LITHOGRAPHIC MASK AND MASK THEREFOR

[75] Inventors: William Joseph Dauksher, Mesa; Pawitter J. S. Mangat, Chandler; Roy Allen Huston, Mesa, all of Ariz.

[73] Assignee: Motorola, Inc., Schaumburg, Ill.

[21] Appl. No.: 09/126,140

[22] Filed: Jul. 30, 1998

[51] Int. Cl.$^7$ ........................................................ G03F 9/00
[52] U.S. Cl. .............................................. 430/5; 430/296
[58] Field of Search ............................... 430/5, 322, 323, 430/296; 378/34, 35

[56] References Cited

U.S. PATENT DOCUMENTS 4,855,197  8/1989  Zapka et al. ................................. 430/5

*Primary Examiner*—S. Rosasco
*Attorney, Agent, or Firm*—James L. Clingan, Jr.

[57] ABSTRACT

A method for patterning a semiconductor device using a lithographic mask (300) having a membrane layer (204) overlying an opening in a substrate. The membrane layer supports a scattering layer (208), and has a varying content of silicon through a thickness thereof, that is, along the direction that is normal to the substrate. In one embodiment, the content of silicon increases along the normal direction, outward from the substrate. The mask has improved durability and reduces occurrences of pinhole defects in the membrane layer.

34 Claims, 3 Drawing Sheets

METHOD OF FORMING A SEMICONDUCTOR DEVICE UTILIZING LITHOGRAPHIC MASK AND MASK THEREFOR

FIELD OF THE INVENTION

The present invention relates generally to semiconductor manufacturing, and more particularly to forming a semiconductor device utilizing a lithographic patterning mask, such as a SCALPEL (Scattering with Angular Limitation in Projection Electron-Beam Lithography) mask.

BACKGROUND OF THE INVENTION

One goal in modern semiconductor fabrication is to improve the density of active elements provided on a single semiconductor die, thus increasing the number of die per wafer. As is known in the art, very large scale integration (VLSI) has evolved into ultra-high large scale integration (ULSI). In order to improve density without overly increasing die size, and more importantly, to improve device speed, there is ongoing investigation in decreasing further the critical dimension (CD) of active elements provided on the semiconductor die. Lithographic techniques are typically used in the formation of multilevel circuits on a semiconductor die. Currently, lithographic techniques take advantage of i-line (365 nanometer) and deep ultra-violet (DUV, 248 nanometer) energy sources. By decreasing wavelength of the energy utilized in these lithographic techniques, smaller CD's may be realized. Accordingly, smaller wavelength, higher energy sources have been investigated, including DUV (193 nanometers), EUV (extreme ultra-violet, approximately 11.0 to 13.4 nanometers), and X-ray lithography.

Another lithographic technique, projection electron beam lithography, shows potential in meeting the needs of several generations of semiconductor devices, including increased throughput and fine critical dimension (CD) control. In general, a projection electron-beam lithography system scans a beam across a mask to create an image on the semiconductor device. Electron optics can be inserted to provide a means of image reduction. One particular type of projection electron beam lithography is known as Scattering with Angular Limitation in Projection Electron-Beam Lithography. The basic principles of this technique are illustrated in prior art FIG. 1.

Turning to FIG. 1, the basic principles of SCALPEL are illustrated. As shown, a mask 10 having a patterned scattering layer 14 is provided on membrane 12, through which an electron beam is projected as represented by the arrows. Particularly, the patterned scattering layer has a higher atomic number than that of the membrane. The scattering effect of the electron beam through portions of the mask is illustrated in FIG. 1. As shown, those portions of the electron beam that pass through the scattering layer 14 tend to be scattered to a greater extent as compared with those portions that pass through the membrane material having no scattering layer 14.

As shown, the electron beam which passes through the mask, is focused through an electron focusing system, represented by lens 20. The electron beam then passes through back focal plane filter 30 having an aperture that is provided to permit passage of those portions of the electron beam that were not scattered by the scattering layer of the mask 10, through some finite angle. The electron beam is then projected onto a semiconductor wafer 40 having a plurality of die 42 and a resist layer 44 formed thereon by conventional techniques such as by spinning-on. The electron beam forms a high contrast image including areas of high intensity formed by those portions of the electron beam that pass between patterned portions of the mask 10, and areas of relatively low intensity formed by those portions of the electron beam that pass through the patterned areas of the mask 10. In this way, a high-resolution image may be projected onto the resist layer, which is then developed to form a patterned resist layer. Thereafter, the material exposed through the patterned resist layer may be etched using an appropriate etchant. It is noted that the power of the system may be adjusted so as to provide a 3–5× reduction in image size, typically 4×.

Turning to FIGS. 2-1 to 2-4, a typical process for forming a mask for SCALPEL use is illustrated. First, a silicon substrate 102, such as on the order of 300–800 microns in thickness and 100–300 millimeters in diameter, is provided. The substrate 102 is formed of monocrystalline silicon, but other materials may be utilized. The substrate 102 is subjected to an LPCVD (low pressure chemical vapor deposition) process to form silicon-rich silicon nitride bottom layer 100 and membrane layer 104 on opposing major surfaces of the substrate. Layers 100 and 104 are typically on the order of 1,500 angstroms of thickness. Thereafter, an etch stop layer 106 is deposited upon membrane layer 104, typically on the order of 100 angstroms in thickness. A scattering layer 108 on the order of 300 angstroms in thickness is then provided on the etch stop layer 106. Typically, the etch stop layer is formed of Cr, while the scattering layer may be formed of any one of several high atomic number species, such as W, Ta, silicides and/or nitrides thereof. Preferably, at least one element has an atomic number greater than 72.

Turning to FIG. 2-2, an opening 103 is etched in the substrate 102, thereby leaving window portion 109 of relatively small thickness that spans opening 103. A resist 110 is coated and patterned on scattering layer 108, as shown in FIG. 2-3, and scattering layer 108 is etched so as to form patterned scattering layer 108', as shown in FIG. 2-4. According to the final structure shown in FIG. 2-4, the electron beam may pass through the entirety of the window portion 109, and is largely blocked by the substrate 102 along un-etched portions thereof. As shown, the window portion is composed of layers 104, 106, and 108' in FIG. 2-4.

Turning to FIG. 3, a plan view of an entire mask for SCALPEL is illustrated. The mask 10 includes substrate 102, preferably a silicon wafer. As illustrated, the mask 10 includes an array of window portions 109 that are covered by membrane layer 104, as well as by etch stop layer 106 and patterned scattering layer 108'. In the embodiment shown, a 4×34 array of windows is illustrated. However, it is well understood that the number of windows may be modified as understood by one of ordinary skill in the art. Clearly, should a larger substrate be utilized, a larger array may also be incorporated. It is noted that reference numeral 114 represents an alignment feature.

While SCALPEL technology has been demonstrated to provide improved resolution over conventional techniques, including i-line and DUV processing, the present inventors have recognized numerous deficiencies with conventional SCALPEL technology, particularly the mask utilized therefore illustrated hereinabove. More specifically, as stated above, the membrane that spans each of the openings is generally formed of silicon-rich silicon nitride. This particular material is conventionally used because of its stress properties. That is, it has a relatively low tensile stress, on the order of $2 \times 10^9$ dynes/cm$^2$, which is effective to maintain membrane integrity. For example, should the membrane have a compressive stress, the membrane would tend to wrinkle and not provide a proper surface for supporting a scattering layer. On the other hand, a membrane that has a high tensile stress has a tendency to fracture and can not be easily handled. While silicon-rich silicon nitride has adequate integrity as a membrane for supporting a scattering layer, the present inventors have discovered that following etching of the substrate, "pinholes" have been observed in membranes of various masks. Acordingly, there is a need in the art to provide an improved mask having low defectivity while maintaining high structural integrity for use in SCAL-PEL technology.

BRIEF DESCRIPTION OF THE DRAWINGS

FIGS. 2-1 to 2-4 illustrate conventional steps of forming a SCALPEL mask;

FIG. 3 illusrates a plan view of a SCALPEL mask, depicting an array of windows;

FIG. 4 illustrates an embodiment of the present invention having a 3-layer composite membrane layer.

Figure 1:
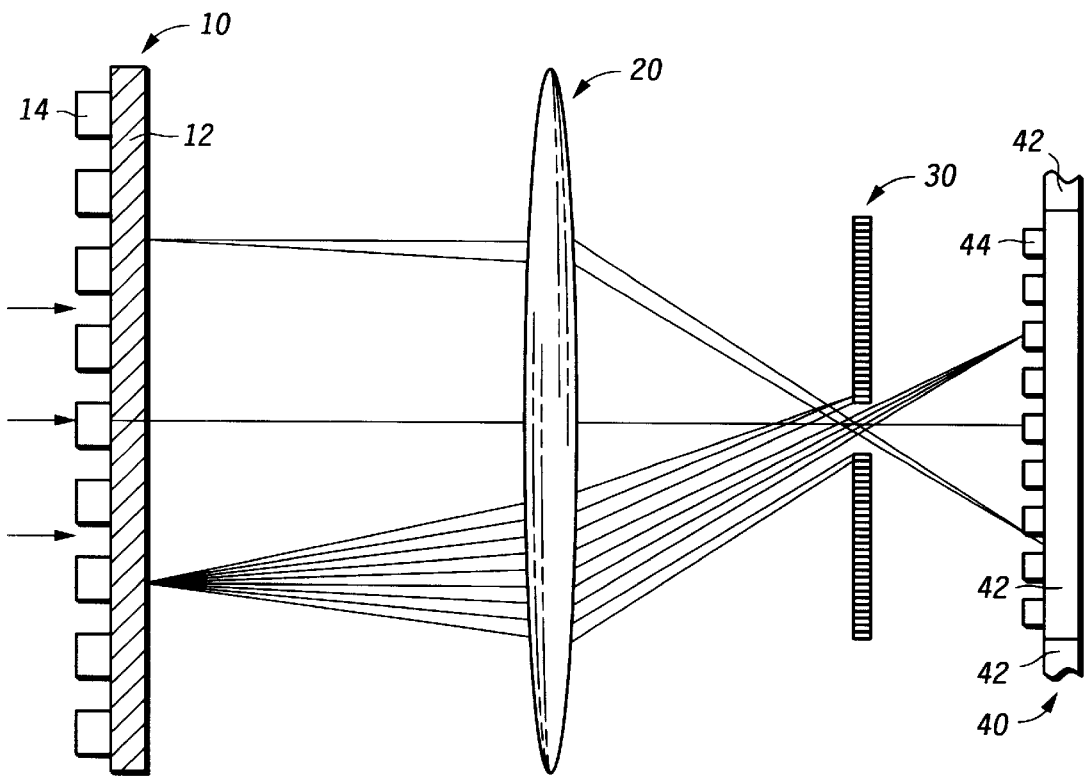
FIG. 1 illustrates the principles of scattering with angular limitation in projection electron-beam lithography (SCALPEL) technology.

It will be appreciated that for simplicity and clarity of illustration, elements illustrated in the figures have not necessarily been drawn to scale. For example, the dimensions of some of the elements may be exaggerated relative to other elements for clarity. Further, where considered appropriate, reference numerals have been repeated among the figures to indicate corresponding or analogous elements.

DETAILED DESCRIPTION OF THE DRAWINGS

The present inventors have recognized that the pinhole defects observed in various masks can result in low yield since the pinholes may contribute to breaking of the membranes. After investigating pinhole defects, several causes have been identified, including processing defects, such as unwanted particles present in the film or on the substrate. These particular process defects might be addressed in a conventional manner as addressed in the semiconductor fabrication industry. For example, better process control may be utilized, clean steps may be employed, and routine preventative maintenance of tools may be carried out. While process-related defects in the membrane may be easily addressed, the present inventors have recognized another, more challenging phenomena that may be responsible for pinhole defects, namely that the membrane, which is formed of silicon-rich silicon nitride, may be compositionally non-uniform. Particularly, the membrane may have regions that are excessively silicon rich.

Figures 1, 2:
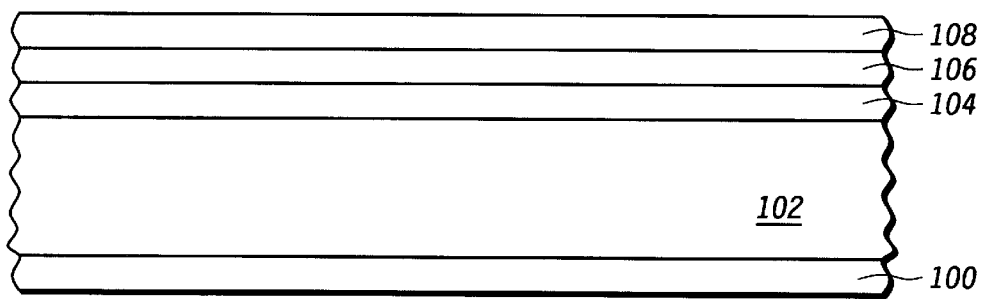
Figure 2:
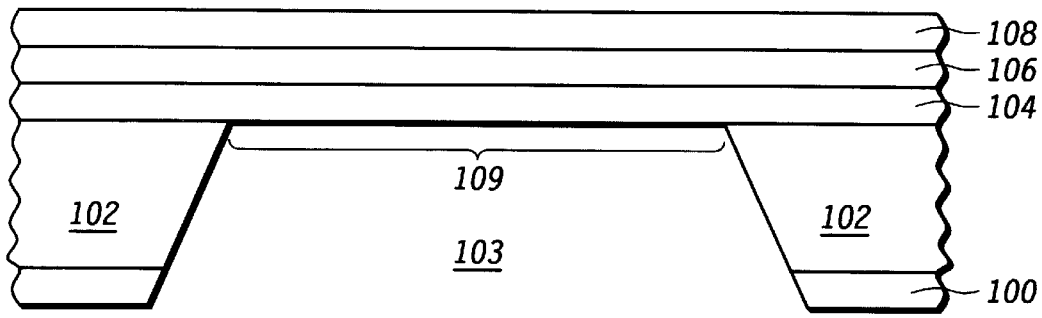
Figures 2, 3:
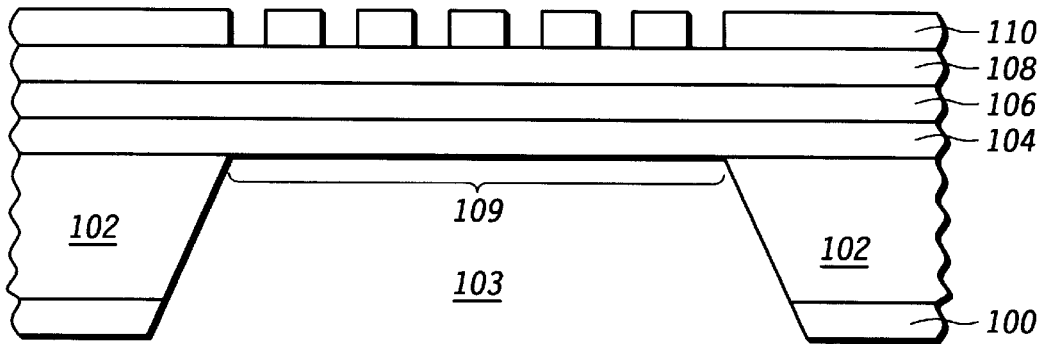
Figures 2, 3, 4:
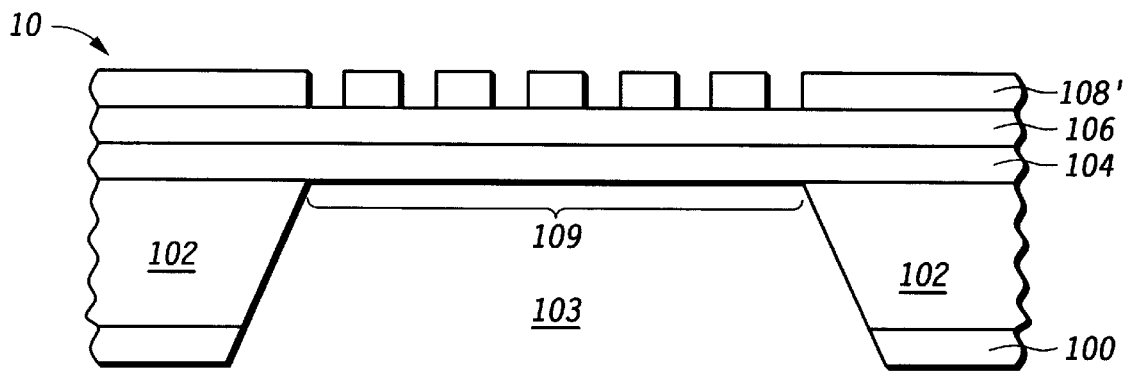
Figure 3:
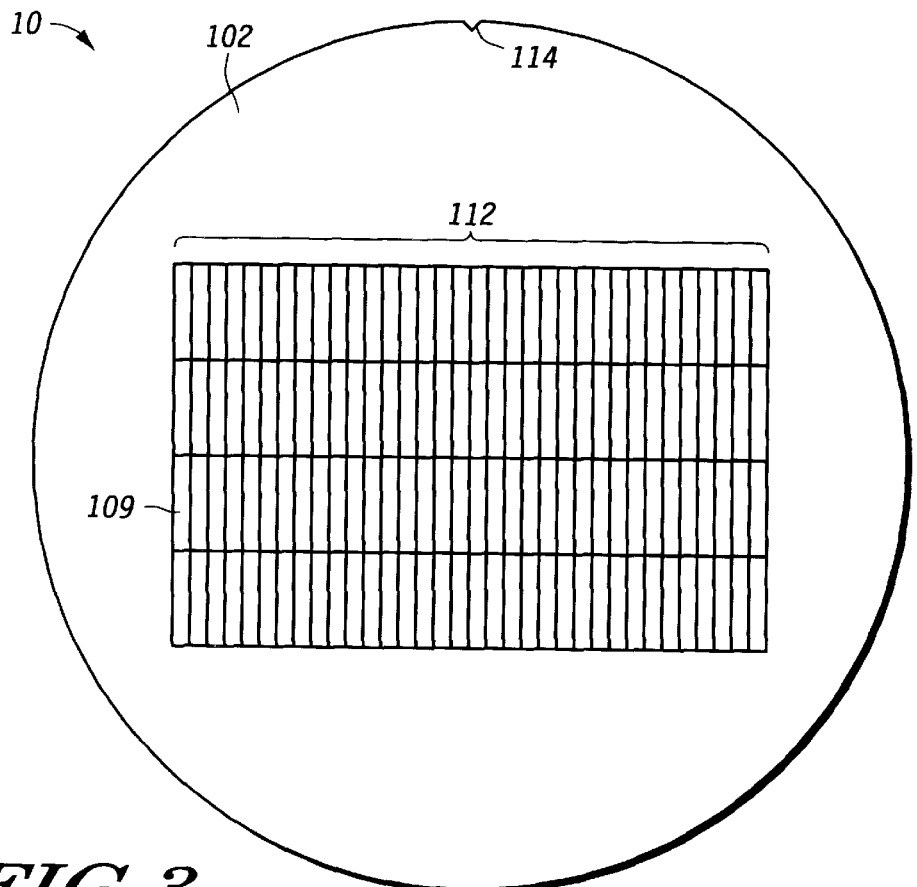
Figure 4:
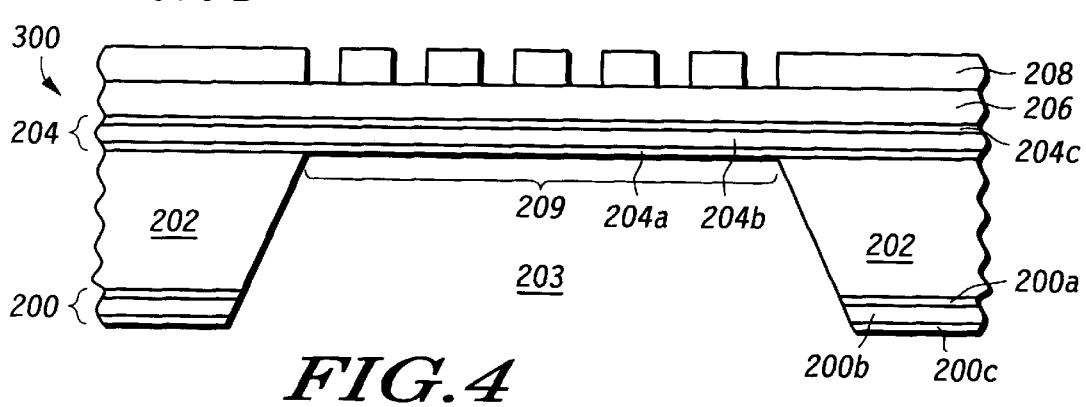

Turning to FIG. 4, a first embodiment of the present invention is illustrated, including some of the basic features illustrated in connection with prior art discussed above. The bulk of mask 300 is formed by silicon substrate 202. However, it is understood that while silicon is used in this particular embodiment for the substrate, other materials as well may be employed, such as gallium arsenide, silicon carbide, etc. Rather than a single silicon-rich silicon nitride layer, the membrane layer 204 (as well as bottom layer 200) takes on a composite structure. Particularly, membrane layer 204 has a composite structure or sandwich structure comprised of a first layer 204a formed of stoichiometric SiN (i.e., $Si_3N_4$) in contact with the substrate, a second layer 204b formed of silicon-rich silicon nitride, and a third layer 204c formed of stoichiometric silicon nitride. The membrane layer generally has an overall thickness in a range of 300 to 3000 angstroms, preferably within a range of about 750 to 1500 angstroms, and overlies the primary surface of the substrate. In this structure, first and third layers 204a, 204c generally have a thickness on the order of 200 to 500 angstroms, preferably, within a range of 220 to 270 angstroms, such as about 250 angstroms. The second layer 204b is generally thicker than the first and third layer and falls within a range of approximately 500 to 1100 angstroms, preferably about 1000 angstroms, such as between 960 and 1040 angstroms. As shown, the membrane layer includes a window portion 209 spanning the opening 203. According to the embodiment shown in FIG. 4, the membrane layer 204 is formed via LPCVD, and accordingly, a mirror-image of layer 204 is formed on the opposite major surface (secondary surface) of substrate 202. Particularly, a bottom layer 200 is formed so as to overlie the secondary surface of the substrate. The bottom layer 200 has a composite structure, including first layer 200a, second layer 200b, and third layer 200c, paralleling the materials and thicknesses of the layers of the composite membrane layer 204. According to this structure, the composite membrane layer 204 provides several advantages.

By use of stoichiometric silicon nitride for first layer 204a, the pinhole defects are suppressed. Particularly, the silicon nitride is formed so as to be stoichiometric and prevent local concentration of silicon. In this regard, it is noted, that the entirety of the membrane layer 204 is not formed of stoichiometric silicon nitride, since this material has too high of a tensile stress, which results in a membrane susceptible to fracture. To overcome this problem, the stoichiometric silicon nitride used to form first layer 204a is relatively thin, an is supplemented with a silicon-rich silicon nitride material for a second layer 204b. Combination of these materials on one hand prevents propagation of pinholes, and on the other hand provides the proper tensile stress to maintain membrane integrity. In addition, use of stoichiometric silicon nitride for first layer 204a provides increased selectivity to the silicon material of substrate 202, thereby improving etch resistance of the etchant used to form opening 203, typically KOH. The mask 300 shown in FIG. 4 also includes etch stop layer 206, and patterned scattering layer 208, similar to those layers shown above with respect to the prior art. The patterned scattering layer 208, may be comprised of a material from a group consisting of tungsten, titanium, tantalum, cobalt, silicides and/or nitrides thereof, and gold. Preferably, at least one element has an atomic number greater than 72.

While a combination of stoichiometric silicon nitride, silicon-rich silicon nitride, and stoichiometric silicon nitride for formation of the membrane layer 204 has been disclosed above, other materials may be substituted. For example, stoichiometric silicon carbide (SiC) may be substituted for the stoichiometric silicon nitride, for layer 204a. In addition, the silicon-rich silicon nitride of second layer 204b may be substituted with silicon-rich silicon carbide, or amorphous silicon. In one particular embodiment, amorphous silicon provides several advantages. Particularly, amorphous silicon is more transparent to the electron beam during subsequent use of the mask for patterning, which is desirable. In addition, use of amorphous silicon permits use of the other techniques for formation of the membrane layer 204. For example, while LPCVD is generally utilized for deposition of stoichiometric as well as silicon-rich silicon nitride, amorphous silicon may be deposited using physical vapor deposition (PVD), and other techniques.

Further, the bottom layer 200 functions as a masking layer which is patterned for subsequent formation of opening 203. In this regard, in the embodiment that uses amorphous silicon for second layer 204b of the composite membrane layer 204, layer 200b would be eliminated, since amorphous silicon forming layer 200b would be susceptible to unwanted etching due to exposure to the etchant material (e.g., KOH).

While the embodiment shown in FIG. 4 has a composite membrane layer 204 including a plurality of discrete sub-layers, the membrane layer 204 may be modified so as to have a graded structure, including no discrete or discernible layers. Such a structure may be easily formed during deposition via LPCVD, by modifying the ratio of silicon-containing gas to nitrogen-containing gas. For example, in one embodiment, stoichiometric silicon nitride may be formed by setting a ratio of silicon containing gas (dichlorosilane, DCS) to ammonia ($NH_3$) at 1:4, while gradually changing this ratio to 5:1 or 6:1, at 835° C. However, as is understood in the art, the particular ratios of the silicon containing gas and nitrogen containing gas are highly dependent upon the particular tool utilized for deposition. Accordingly, the ratios described above are merely illustrative.

As is understood, according to the present invention, the membrane layer, whether in composite form or graded, has a varying content of silicon along the thickness of the membrane layer. Alternatively stated, the content of silicon varies along a direction that is normal to the substrate. As shown, the silicon content increases along the direction which is normal to the substrate, extending away from the substrate. One variation of this allows for the silicon content to subsequently decrease, again. In this way, the portion of the membrane layer which is exposed to the etchant during etching of opening 203 has a relatively lower content of silicon, as compared to the balance of the membrane layer. Accordingly, etching selectivity between the membrane layer and the substrate is improved, and occurrence of pinhole defects is suppressed.

Figure 5:
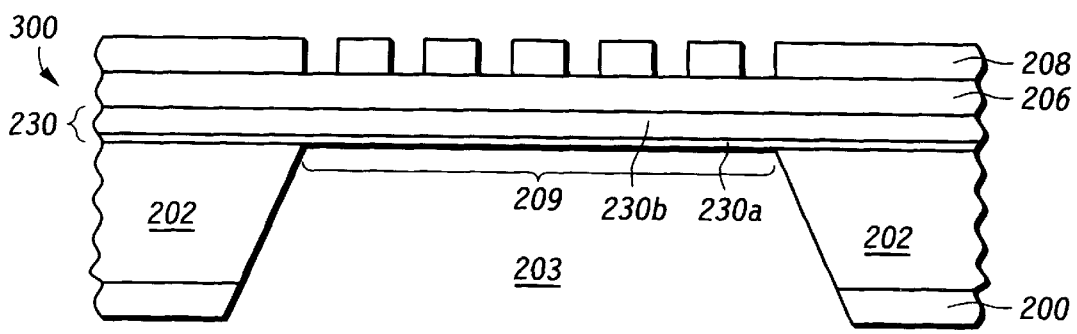
FIG. 5 illustrates a second embodiment of the present invention having a 2-layer composite structure.

Turning to FIG. 5, a second embodiment of the present invention is illustrated. The embodiment shown in FIG. 5 differs substantially from that shown in FIG. 4 only with respect to the structure of membrane layer 230. In this particular embodiment, a two-layer structure is utilized rather than a three-layer structure illustrated in FIG. 4. In this regard, the materials utilized for first layer 230a and second layer 230b of membrane layer 230 are essentially the same as those utilized for first layer 204a and second layer 204b respectively, of membrane layer 204. However, since the third layer of the composite membrane layer is eliminated in the embodiment illustrated in FIG. 5, it is important to restrict exposure of the top side of the mask to etchant material, during etching of opening 203. More specifically, in the embodiment shown in FIG. 4 since the membrane layer 204 has a third layer 204c formed of stoichiometric silicon nitride (or silicon carbide, for example), it functions as an effective etch stop to prevent etchant material from attacking the silicon-rich silicon nitride or amorphous silicon of the composite membrane layer 204. On the other hand, since no capping or protective layer is utilized in the embodiment shown in FIG. 5, it is important to restrict exposure of the top surface of membrane layer 230 to the etchant material. Finally, it is noted that the bottom layer 200 that functions as a masking layer may be formed of similar material as that shown in FIG. 4. However, bottom layer 200 should not be formed of amorphous silicon, and preferably not silicon-rich silicon nitride, since such materials are not largely resistant to the etchant materials and undesirably degrade during etching of opening 203. As such, such materials may not provide an effective mask for forming the opening.

Following fabrication of a mask according to any of the above-described embodiments, the mask may be used for fabrication of a semiconductor device, as described above with respect to FIG. 1. Particularly, a resist on a semiconductor device is subjected to an electron beam, which forms a pattern on the resist. The resist is developed, and an underlying layer or layers of the semiconductor device are patterned by etching.

As has been described herein, a mask for SCALPEL having an improved membrane has been disclosed. The present invention provides several advantages, including flexibility in material selection, and flexibility in process methodology. In addition, the membrane properties may be easily tailored to meet the needs of the end user. While the mask described herein has been described with application to SCALPEL, it may be extended to other membrane-based technologies, including other lithographic technologies such as x-ray lithography. While the present invention has been described herein with particular detail with respect to embodiments of the present invention, it is well understood that one of ordinary skill in the art may modify the invention without departing from the scope of the claims attached hereto.

What is claimed is:

1. A lithographic mask, comprising:
    a substrate having a primary surface and a secondary surface opposite the primary surface, and an opening extending into the substrate through the secondary surface;
    a membrane layer having a thickness and extending over the primary surface, the membrane layer including a window portion that overlies the opening in the substrate, the membrane layer having a varying content of silicon along a direction that is normal to the substrate; and
    a patterned scattering layer overlying the membrane layer, at least along the window portion of the membrane layer.

2. The lithographic mask of claim 1, wherein the membrane layer has an increasing content of silicon along said direction which is normal to the substrate, extending away from the substrate.

3. The lithographic mask of claim 2, wherein the membrane layer has a composite structure, including a first layer overlying the substrate and a second layer overlying the first layer, the first layer having a first content of silicon, and the second layer having a second content of silicon, the second content being greater than the first content.

4. The lithographic mask of claim 3, wherein the first layer comprises stoichiometric silicon nitride.

5. The lithographic mask of claim 3, wherein the first layer comprises stoichiometric silicon carbide.

6. The lithographic mask of claim 3, wherein the second layer comprises silicon-rich silicon nitride.

7. The lithographic mask of claim 3, wherein the second layer comprises silicon-rich silicon carbide.

8. The lithographic mask of claim 3, wherein the second layer comprises amorphous silicon.

9. The lithographic mask of claim 2, wherein the membrane layer is graded, having a gradually increasing content of silicon.

10. The lithographic mask of claim 9, wherein the membrane layer comprises stoichiometric silicon nitride overlying and in contact with the substrate.

11. The lithographic mask of claim 10, wherein the membrane layer further comprises silicon-rich silicon nitride overlying the stoichiometric silicon nitride, the silicon-rich silicon nitride having gradually increasing silicon content along the direction that is normal to the substrate.

12. The lithographic mask of claim 1, further comprising a bottom layer overlying the substrate along the secondary surface, wherein the bottom layer is a masking layer for patterning the opening.

13. The lithographic mask of claim 1, wherein the substrate comprises a monocrystalline silicon.

14. The lithographic mask of claim 1, wherein the patterned scattering layer comprises a material from a group consisting of tungsten, titanium, tantalum, cobalt, and gold.

15. The lithographic mask of claim 14, wherein the patterned scattering layer comprises at least one of a silicide and nitride of tungsten, titanium, tantalum, or cobalt.

16. The lithographic mask of claim 1, wherein the membrane layer has a thickness of approximately 300 to 3000 angstroms.

17. The lithographic mask of claim 16, wherein the membrane layer has a thickness of approximately 750 to 1500 angstroms.

18. A method of patterning a semiconductor device by scattering with angular limitation in projection electron lithography, comprising the steps:

forming a resist on a semiconductor device;

projecting an electron beam through a mask and onto the resist formed on the semiconductor device, wherein the mask comprises: (i) a substrate having a primary surface and a secondary surface opposite the primary surface, and an opening extending into the substrate through the secondary surface, (ii) a membrane layer having a thickness and extending over the primary surface, the membrane layer including a window portion that overlies the opening in the substrate, the membrane layer having a varying content of silicon along a direction that is normal to the substrate, and (iii) a patterned scattering layer overlying the membrane layer, at least along the window portion of the membrane layer;

developing the resist; and patterning the semiconductor device.

19. The method of claim 18, wherein the membrane layer has an increasing content of silicon along said direction which is normal to the substrate, extending away from the substrate.

20. The method of claim 19, wherein the membrane layer has a composite structure, including a first layer overlying the substrate and a second layer overlying the first layer, the first layer having a first content of silicon, and the second layer having a second content of silicon, the second content being greater than the first content.

21. The method of claim 20, wherein the first layer comprises stoichiometric silicon nitride.

22. The method of claim 20, wherein the first layer comprises stoichiometric silicon carbide.

23. The method of claim 20, wherein the second layer comprises silicon-rich silicon nitride.

24. The method of claim 20, wherein the second layer comprises silicon-rich silicon carbide.

25. The method of claim 20, wherein the second layer comprises amorphous silicon.

26. The method of claim 19, wherein the membrane layer is graded, having a gradually increasing content of silicon.

27. The method of claim 26, wherein the membrane layer comprises stoichiometric silicon nitride overlying and in contact with the substrate.

28. The method of claim 27, wherein the membrane layer further comprises silicon-rich silicon nitride overlying the stoichiometric silicon nitride, the silicon-rich silicon nitride having gradually increasing silicon content along the direction that is normal to the substrate.

29. The method of claim 18, further comprising a bottom layer overlying the substrate along the secondary surface, wherein the bottom layer is a masking layer for patterning the opening.

30. The method of claim 18, wherein the substrate comprises a monocrystalline silicon.

31. The method of claim 18, wherein the patterned scattering layer comprises a material from a group consisting of tungsten, titanium, tantalum, cobalt, and gold.

32. The method of claim 31, wherein the patterned scattering layer comprises a silicide of tungsten, titanium, tantalum, or cobalt.

33. The method of claim 18, wherein the membrane layer has a thickness of approximately 300 to 3000 angstroms.

34. The method of claim 33, wherein the membrane layer has a thickness of approximately 750 to 1500 angstroms.

* * * * *